(12) United States Patent
Okutsu (10) Patent No.: US 7,952,877 B2
(45) Date of Patent: May 31, 2011

(54) ELECTRONIC APPARATUS

(75) Inventor: Isao Okutsu, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 12/426,813

(22) Filed: Apr. 20, 2009

(65) Prior Publication Data
US 2010/0079953 A1 Apr. 1, 2010

(30) Foreign Application Priority Data

Sep. 29, 2008 (JP) ................................. 2008-251734

(51) Int. Cl.
*H05K 7/20* (2006.01)
(52) U.S. Cl. ..................... 361/700; 257/719; 361/719
(58) Field of Classification Search .................. 257/719; 361/679.47, 679.52, 700, 719
See application file for complete search history.

(56) References Cited

U.S. PATENT DOCUMENTS

| | | | | |
|---|---|---|---|---|
| 4,929,185 A | * | 5/1990 | Wong et al. | 439/74 |
| 5,792,433 A | * | 8/1998 | Kadoya | 422/186.3 |
| 6,944,031 B2 | | 9/2005 | Takami | |
| 7,042,727 B2 | * | 5/2006 | Ulen et al. | 361/704 |
| 7,170,750 B2 | | 1/2007 | Tanaka | |
| 7,388,746 B2 | * | 6/2008 | Park et al. | 361/699 |
| 7,595,992 B2 | * | 9/2009 | Koga | 361/719 |
| 7,684,198 B2 | * | 3/2010 | Fang | 361/719 |
| 7,742,295 B2 | * | 6/2010 | Hata et al. | 361/679.47 |
| 2003/0112609 A1 | | 6/2003 | Takami | |
| 2004/0001316 A1 | * | 1/2004 | Kamikawa et al. | 361/700 |
| 2007/0200190 A1 | | 8/2007 | Koga | |
| 2009/0073655 A1 | * | 3/2009 | Takakusaki et al. | 361/696 |

FOREIGN PATENT DOCUMENTS

| | | |
|---|---|---|
| JP | 2003-101269 | 4/2003 |
| JP | 2003-188489 | 7/2003 |
| JP | 2005-166715 | 6/2005 |
| JP | 2007-034699 | 2/2007 |
| JP | 2007-234728 | 9/2007 |
| JP | 2007-234860 | 9/2007 |

OTHER PUBLICATIONS

Japanese Patent Application No. 2008-251734, Notification of Reasons for Rejection, mailed Jun. 30, 2009, (English Translation).

* cited by examiner

*Primary Examiner* — Gregory D Thompson
(74) *Attorney, Agent, or Firm* — Blakely, Sokoloff, Taylor & Zafman, LLP (57) ABSTRACT

According to one embodiment, an electronic apparatus includes a connector electrically connecting a sub-board to a main board, a heat producing component mounted on the sub-board, a heat pipe opposed to the heat producing component, a pressing member, and fixing members. The pressing member includes a main part opposed to the heat pipe, and a plurality of fixing parts extending from the main part and being located closer to the connector than the main part is. The plurality of fixing members fix the fixing parts of the pressing member to the sub-board, and fix the sub-board to support members at positions that are closer to the connector than the main part is.

11 Claims, 8 Drawing Sheets

ELECTRONIC APPARATUS

CROSS-REFERENCE TO RELATED APPLICATIONS

This application is based upon and claims the benefit of priority from Japanese Patent Application No. 2008-251734, filed Sep. 29, 2008, the entire contents of which are incorporated herein by reference.

BACKGROUND

1. Field

One embodiment of the invention relates to an electronic apparatus provided with a sub-board.

2. Description of the Related Art

Some electronic apparatuses are provided with a sub-board in addition to a main board. The main board is provided with a connector connecting the sub-board to the main board.

In Jpn. Pat. Appln. KOKAI Publication No. 2007-234860, a support structure in which a plurality of circuit boards are supported is disclosed. On each of the plurality of circuit boards, a connector is mounted. Two connectors are engaged with each other, whereby two circuit boards are electrically connected to each other. A support component is provided on one circuit board. The support component includes a head part to be inserted in a guide hole of the other circuit board. When the two connectors are engaged with each other, a wing provided on the head part of the support component fixes the other circuit board.

In Jpn. Pat. Appln. KOKAI Publication No. 2005-166715, an electronic apparatus provided with a board, heat producing component, heat radiating plate, and retaining member is disclosed. The retaining member includes a pressure part pressing the heat radiating plate from the opposite side of the heat producing component, and leg parts extending from the pressure part in three directions. End part of each of the leg parts is fixed to the board.

Incidentally, an electronic apparatus of the recent years is desired to be further improved in the mounting density. However, when simplification of various mounting structure is contrived in order to promote the high-density mounting, there is the possibility of the connector becoming subject to stress. When stress is frequently imposed on the connector, the connection reliability of the connector is lowered.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic apparatus comprises a connector electrically connecting a sub-board to a main board, a heat producing component mounted on the sub-board, a heat pipe opposed to the heat producing component, a pressing member, and fixing members. The pressing member comprises a main part opposed to the heat pipe, and a plurality of fixing parts extending from the main part and being located closer to the connector than the main part is. The plurality of fixing members fix the fixing parts of the pressing member to the sub-board, and fix the sub-board to support members at positions that are closer to the connector than the main part is.

Embodiments of the present invention will be described below on the basis of drawings in which the present invention is applied to a portable computer.

First Embodiment

Figure 1:
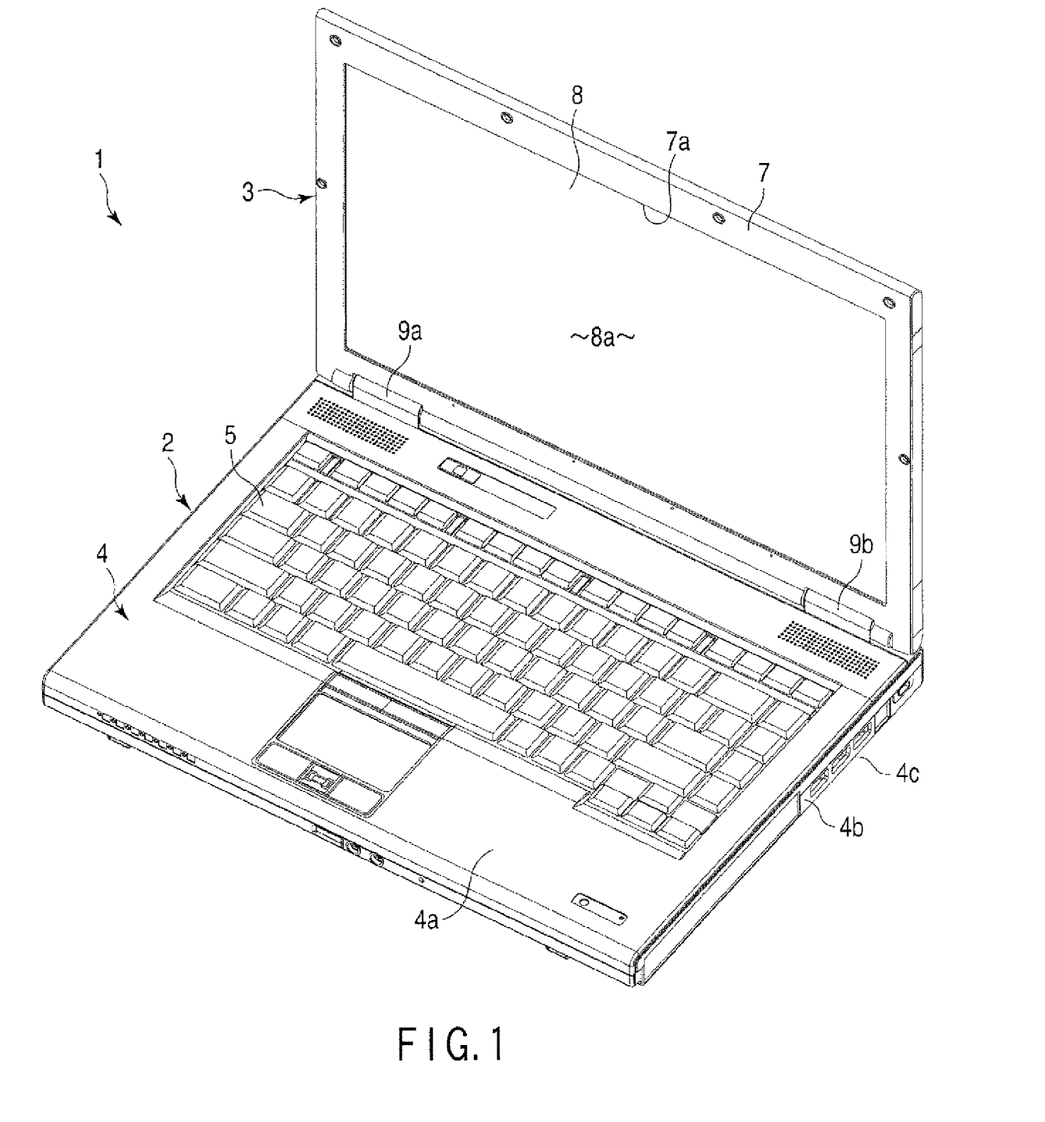
FIG. 1 is an exemplary perspective view of a portable computer according to a first embodiment of the present invention.

In FIGS. 1 to 4, a portable computer 1 as an electronic apparatus according to a first embodiment of the present invention is disclosed. As shown in FIG. 1, the portable computer 1 comprises a main unit 2 which is an electronic apparatus main body, and a display unit 3.

The main unit 2 comprises a housing 4 formed into a flat box-like shape. The housing 4 comprises an upper wall 4a, a peripheral wall 4b, and a lower wall 4c. The upper wall 4a supports a keyboard 5. The housing 4 contains a board unit 6 (see FIG. 2) therein.

As shown in FIG. 1, the display unit 3 comprises a display housing 7, and a display panel 8 contained in the display housing 7. The display panel 8 comprises a display screen 8a. The display screen 8a is exposed to the outside of the display housing 7 through an opening part 7a in the front of the display housing 7.

The display unit 3 is supported at a rear end part of the housing 4 by means of, for example, a pair of hinge parts 9a and 9b. The display unit 3 is rotatable between a closed position in which the display unit 3 is laid to cover the upper wall 4a of the housing 4 from above, and an opened position in which the display unit 3 is raised relative to the upper wall 4a.

Figure 2:
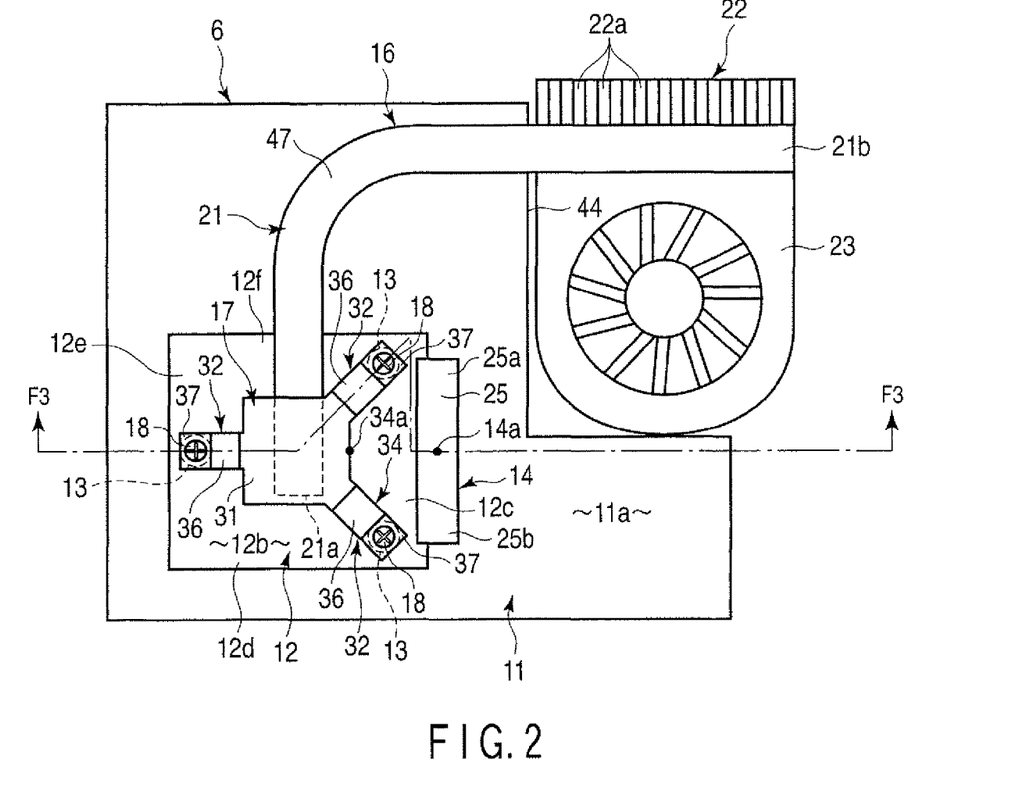
FIG. 2 is an exemplary plan view of a board unit according to the first embodiment of the present invention.
Figure 3:
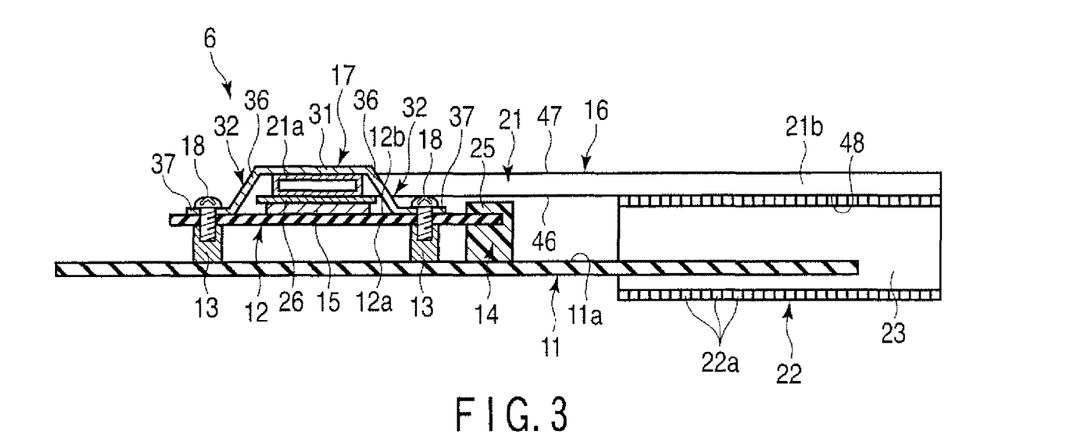
FIG. 3 is an exemplary cross-sectional view of the board unit shown in FIG. 2 taken along line F3-F3.
Figure 4:
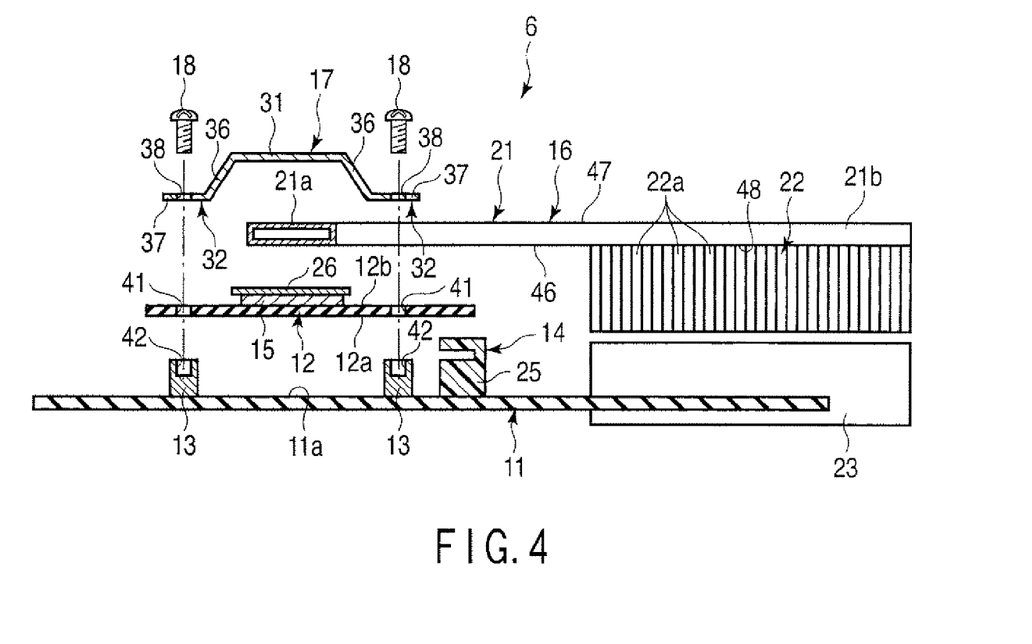
FIG. 4 is an exemplary cross-sectional view showing the board unit shown in FIG. 3 in a partly exploded state.

As shown in FIGS. 2 to 4, the board unit 6 comprises a main board 11, a sub-board 12, a plurality of support members 13, a connector 14, a heat producing component 15, a cooling device 16, a pressing member 17, and a plurality of fixing members 18. The cooling device 16 comprises a heat pipe 21, a fin unit 22, and a cooling fan 23.

The sub-board 12 (daughterboard) is arranged horizontal, for example, above (or below) the main board 11. The sub-board 12 is opposed to the main board 11 with a gap held between the sub-board 12 and the main board 11. The sub-board 12 comprises a first surface 12a facing the main board 11, and a second surface 12b facing the opposite side of the first surface 12a.

The heat producing component 15 is mounted on the second surface 12b of the sub-board 12. The heat producing component 15 is an electronic component that generates heat when it is used and, for example, an IC chip for graphic use corresponds thereto as a specific example. However, the heat producing component mentioned in the present invention is not limited to the above example, and various components for which heat radiation is desired correspond thereto.

As shown in FIG. 3, the plurality of (for example, three) support members 13 are interposed between the main board 11 and the sub-board 12. An example of each of the support members 13 is a stud provided on the main board 11 to stand on the board 11. The support members 13 which are the studs are each fixed to the main board 11 by solder-fixation, calking-fixation or the like.

As shown in FIG. 2, the sub-board 12 is formed into, for example, a rectangular shape having four side parts 12c, 12d, 12e, and 12f. As shown in FIG. 3, the main board 11 comprises a board surface 11a opposed to the sub-board 12.

The connector 14 is mounted on the main board 11. On the other hand, pattern wiring (not shown) configured to serve as connecting terminals is provided at an end part of the sub-board 12. The connector 14 according to this embodiment is a connector of a so-called right-angled type. The sub-board 12 is detachably inserted into the connector 14 along the board surface 11a of the main board 11. The connector 14 electrically connects the sub-board 12 to the main board 11. It should be noted that the connector 14 may be a connector of a so-called straight type with which the sub-board 12 is attached to the main board 11 in a direction perpendicular to the board surface 11a of the main board 11.

As shown in FIG. 3, the connector 14 comprises connecting terminals (not shown), and a housing 25 made of a synthetic resin, covering the connecting terminals. The housing 25 is interposed between the main board 11 and the sub-board 12. As shown in FIG. 2, the housing 25 is formed into, for example, a rectangular parallelepiped-like shape. A longitudinal direction of the housing 25 is set along the side part 12c of the sub-board 12. The housing 25 comprises first and second end parts 25a and 25b which are end parts in the longitudinal direction.

As shown in FIG. 2, the heat pipe 21 extends in the housing 4, and comprises a heat receiving part 21a thermally connected to the heat producing component 15, and a heat radiating part 21b thermally connected to the fin unit 22. The heat pipe 21 comprises a container and a working fluid sealed in the container. The heat pipe 21 moves the heat received by the heat receiving part 21a to the heat radiating part 21b by the evaporation and condensation of the working fluid.

As shown in FIG. 3, the heat receiving part 21a of the heat pipe 21 is opposed to the heat producing component 15 from the opposite side of the sub-board 12. A heat receiving member 26 is provided between the heat producing component 15 and the heat pipe 21. A specific example of the heat receiving member 26 is a heat receiving block or a heat receiving plate made of metal, a graphite sheet having thermal conductivity or the like. It should be noted that the heat receiving member 26 may be omitted.

As shown in FIG. 3, the pressing member 17 presses the heat receiving part 21a of the heat pipe 21 against the heat producing component 15. The pressing member 17 comprises a main part 31, and a plurality of fixing parts 32. The main part 31 and the fixing parts 32 cooperate with each other to function as a plate spring.

The main part 31 is formed into, for example, a plate-like shape, and is opposed to the heat receiving part 21a of the heat pipe 21 from the opposite side of the heat producing component 15. The plurality of fixing parts 32 each extend from a peripheral part of the main part 31 toward the sub-board 12. As shown in FIG. 2, the plurality of fixing parts 32 each extend from the peripheral part of the main part 31 in directions different from each other (for example, directions different from each other by about 120°). The pressing member 17 according to this embodiment comprises, for example, three fixing parts 32, and is formed into a substantial Y-shape.

It should be noted that the substantial Y-shape mentioned in the present invention need not have a strict Y-shape, and comprises, for example, a Y-shape having projecting parts between the fixing parts 32 as shown in FIG. 2.

As shown in FIG. 2, the two fixing parts 32 of the plurality of fixing parts 32 are located closer to the connector 14 than the main part 31 is. These two fixing parts 32 are arranged side by side in the longitudinal direction of the connector 14. The one fixing part 32 of the above two fixing parts 32 is opposed to the first end part 25a which is the one end part of the connector 14 in the longitudinal direction thereof. The other fixing part 32 of the above two fixing parts 32 is opposed to the second end part 25b which is the other end part of the connector 14 in the longitudinal direction thereof.

As shown in FIG. 2, of the three fixing parts 32, the two fixing parts 32 (that is, the two fixing parts 32 positioned on the connector 14 side with respect to the main part 31) cooperate with each other to form a substantial V-shaped part 34. It should be noted that the substantial V-shaped part mentioned in the present invention need not have a strict V-shape, and comprises, for example, a V-shape having a flat part between the two fixing parts 32 as shown in FIG. 2.

In the pressing member 17, the substantial V-shaped part 34 is arranged to be opposed to the connector 14. In other words, the connector 14 is arranged on the front side of the substantial V-shaped part 34 when viewed from the pressing member 17. That is, the connector 14 is positioned between the two fixing parts 32 of the pressing member 17 extending in the directions different from each other. A central part 34a of the substantial V-shaped part 34 is opposed to a central part 14a of the connector 14. That is, the two fixing parts 32 forming the substantial V-shaped part 34 each equally extend toward both the end sides of the connector 14.

Each of the fixing parts 32 comprises an inclined part 36 slantingly extending from the peripheral part of the main part 31 toward the sub-board 12, and a distal end part 37 extending along the sub-board 12. The distal end part 37 of each of the fixing parts 32 comprises a through-hole part 38 (i.e., a first through-hole part).

As shown in FIG. 4, the sub-board 12 comprises a plurality of through-hole parts 41 (i.e., second through-hole parts). The plurality of through-hole parts 41 are each provided at positions corresponding to the fixing parts 32 of the pressing member 17 (that is, positions opposed to the fixing parts 32), and communicate with through-hole parts 38 of the fixing parts 32.

As shown in FIGS. 2 to 4, the plurality of support members 13 are arranged at positions corresponding to the through-hole parts 41 of the sub-board 12 (that is, positions opposed to the through-hole parts 41 of the sub-board 12). As shown in FIG. 4, each of the support members 13 comprises a threaded hole part 42 communicating with the through-hole part 41 of the sub-board 12. It should be noted that the "threaded hole part" mentioned in the present description implies a hole part in which a female thread is formed.

As shown in FIG. 2, the plurality of fixing members 18 are attached to the pressing member 17. Each of the fixing members 18 is, for example, a screw. As shown in FIG. 4, the fixing members 18 are attached in the direction from the pressing member 17 toward the main board 11.

As shown in FIG. 3, each of the plurality of fixing members 18 is inserted in the through-hole part 38 of the fixing part 32, and the through-hole part 41 of the sub-board 12, and is engaged with the threaded hole part 42 of the support member 13. As a result, the fixing members 18 fix the pressing member 17 to the sub-board 12, and fix the sub-board 12 to the support members 13. That is, the fixing members 18 fix the sub-board 12 to the main board 11 with the support members 13. In other words, the pressing member 17, the sub-board 12, and the main board 11 are integrally fixed by the fixing members 18.

As shown in FIG. 2, the two fixing members 18 of the plurality of fixing members 18 each fix the pressing member 17 to the sub-board 12 at positions that are closer to the connector 14 than the main part 31 is, and each fix the sub-board 12 to the support members 13.

As shown in FIG. 2, the fin unit 22 comprises a plurality of fins 22a made of metal. The cooling fan 23 is opposed to the fin unit 22, and cools the fin unit 22. The main board 11 comprises a cutout part 44 cut out to avoid the fin unit 22 and the cooling fan 23. The fin unit 22 and the cooling fan 23 are arranged in the cutout part 44, and are arranged away from the main board 11 (that is, not overlapping the main board 11 in the thickness direction of the main board 11).

As shown in FIG. 3, the fin unit 22 is arranged on the main board 11 side of the heat pipe 21 in the thickness direction (the up-and-down direction in FIG. 3) of the main board 11 than the heat pipe 21 is. That is, the fin unit 22 is located closer to the main board 11 than the heat pipe 21 is in the thickness direction of the main board 11.

More specifically, the heat pipe 21 comprises a first area 46 facing the main board 11 (for example, an undersurface area), and a second area 47 directed to the opposite side of the main board 11 (for example, a top surface area). The first area 46 comprises a part 48 extending away from the main board 11. The fin unit 22 is attached to the part 48 of the first area 46 of the heat pipe 21. As shown in FIG. 3, the fin unit 22 and the cooling fan 23 are arranged side by side with the main board 11 in the direction parallel with the first surface 12a of the sub-board 12 (i.e., in the direction along a board surface ha or the main board).

According to the portable computer 1 configured as described above, it is possible to improve the connection reliability of the connector 14. That is, in the portable computer 1, the two fixing parts 32 of the pressing member 17 are positioned closer to the connector 14 than the main part 31 is and, at positions on the connector 14 side of the main part 31, the two fixing members 18 fix the fixing parts of the pressing member 17 to the sub-board 12, and fix the sub-board 12 to the main board 11.

As a result, a fixing structure coupling the sub-board 12 and the main board 11 to each other is realized in the vicinity of the connector 14. The part around the connector 14 is held relatively firm by the fixing structure, and hence even when a load is applied to the sub-board 12, the connector 14 is hardly deformed. That is, the stress imposed on the connector 14 is reduced. As a result, a fault is hardly caused in the connector 14, and the connection reliability is improved.

Further, according to the portable computer 1 according to this embodiment, it is possible to improve the mounting density. For example, the sub-board 12 includes the through-hole parts 41 communicating with the through-hole parts 38 of the pressing member 17; the support members 13, each of which includes a threaded hole part 42 communicating with the through-hole part 41, are arranged at positions corresponding to the through-hole parts 41 of the sub-board 12; and the fixing members 18 are inserted in the through-hole parts 38 of the pressing member 17 and the through-hole parts 41 of the sub-board 12 to be engaged with the threaded hole parts 42 of the support members 13, it is possible to fix the sub-board 12 to the main board 11 by means of the fixing members 18 for fixing the pressing member 17.

In the case where the sub-board 12 is fixed to the main board 11 by mean of the fixing members 18 for fixing the pressing member 17, it is possible to omit the fixing structure to be originally provided to fix the sub-board 12 to the main board 11. That is, it becomes unnecessary to provide dedicated through-hole parts of the sub-board 12 to fix the sub-board 12 to the main board 11, and the board area of the sub-board 12 increases correspondingly. As a result, it is possible to provide wiring patterns even in areas in which through-hole parts are to be originally provided. Further, conversely, it is possible to reduce the size of the sub-board 12 by the amount of the areas in which the through-hole parts are to be originally provided. These facts contribute to the improvement in the mounting density of the portable computer 1. That is, in the portable computer 1, it is possible to improve the connection reliability of the connector 14 while improving the mounting density.

In the case where the two fixing parts 32 positioned on the connector 14 side of the main part 31 are arranged in the longitudinal direction of the connector 14, the part around the connector 14 is held more stable.

The one fixing part 32 of the two fixing parts 32 positioned on the connector 14 side of the main part 31 is opposed to one end part 25a of the connector 14, and the other fixing part 32 of the two fixing parts 32 is opposed to the other end part 25b of the connector 14. As a result, the part around the connector 14 is stably held over the entire length of the connector 14.

The pressing member 17 having the substantial Y-shape is arranged in such a manner that the substantial V-shaped part 34 thereof is opposed to the connector 14. As a result, it is possible to arrange the two fixing parts 32 in the vicinity of the connector 14, and improve the connection reliability of the connector 14 by using the pressing member 17 including only three fixing parts 32.

Second Embodiment

Next, a portable computer 1 as an electronic apparatus according to a second embodiment of the present invention will be described below with reference to FIGS. 5 to 7. It should be noted that the configurations having functions identical with or similar to those of the configurations of the first embodiment described above are denoted by the reference symbols identical with those of the first embodiment, and a description of them will be omitted. Further, the configurations of the portable computer 1 other than those described below are identical with those of the first embodiment described above.

Figure 5:
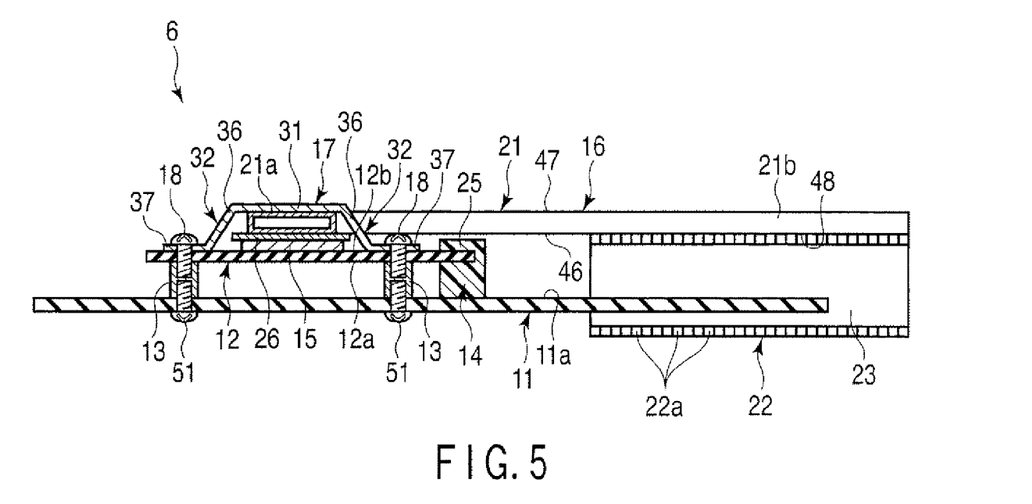
FIG. 5 is an exemplary cross-sectional view of the board unit according to a second embodiment of the present invention.
Figure 6:
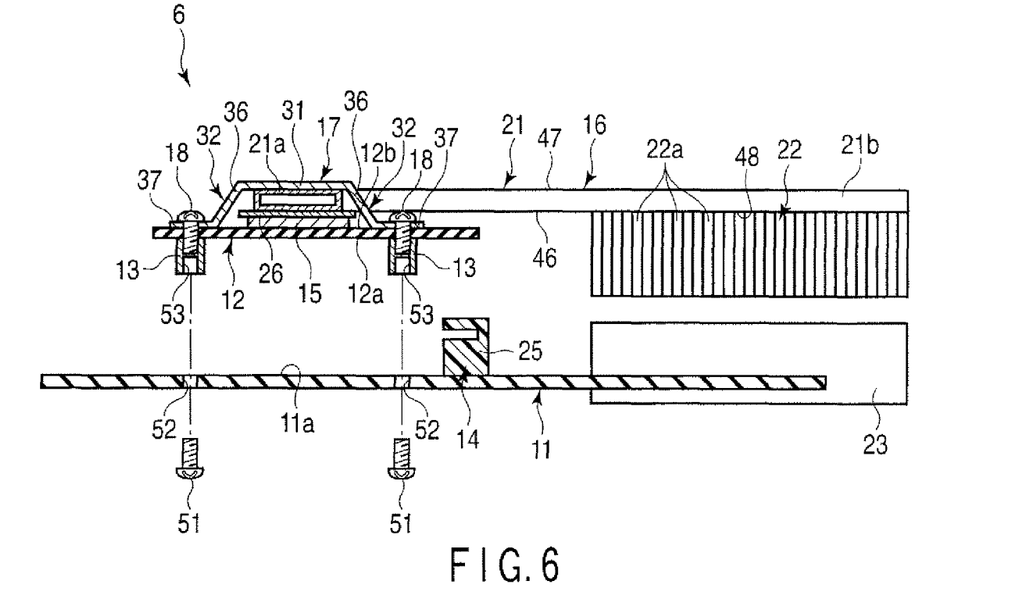
FIG. 6 is an exemplary cross-sectional view of the board unit shown in FIG. 5 in a partly exploded state.
Figure 7:
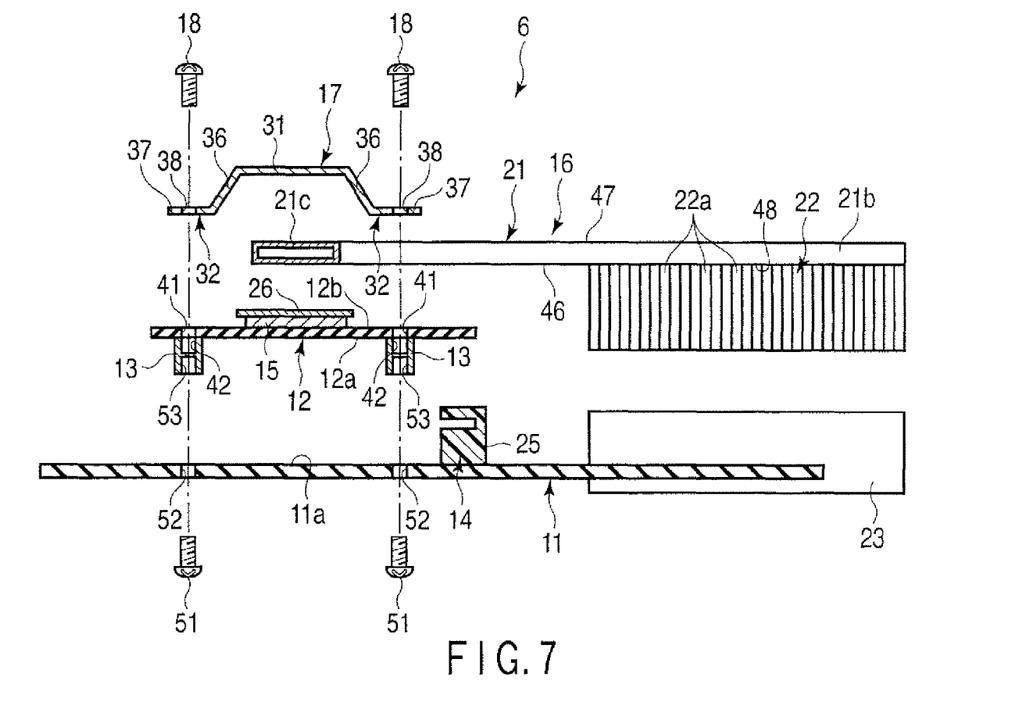
FIG. 7 is an exemplary cross-sectional view of the board unit shown in FIG. 6 in a state where the board unit is further exploded partly.

As shown in FIGS. 6 and 7, support members 13 according to this embodiment are spacers or studs fixed to a sub-board 12. A board unit 6 according to this embodiment is provided with a plurality of other fixing members 51 (hereinafter referred to as second fixing members 51) in addition to fixing members 18 (hereinafter referred to as first fixing members 18). As shown in FIG. 5, the second fixing members 51 are attached to the support members 13 from the opposite side of the first fixing members 18.

As shown in FIG. 6, a main board 11 comprises a plurality of through-hole parts 52 (i.e., third through-hole parts) opposed to the support members 13. Each of the support members 13 comprises another threaded hole part 53 (hereinafter referred to as a second threaded hole part 53) communicating with the through-hole part 52 of the main board 11 in addition to a threaded hole part 42 (hereinafter referred to as a first threaded hole part 42). The first and second threaded hole parts 42 and 53 may communicate with each other.

As shown in FIG. 5, each of the plurality of second fixing members 51 is inserted in the through-hole part 52 of the main board 11, and is engaged with the second threaded hole part 53 of the support member 13. As a result, the second fixing members 51 fix the support members 13 to the main board 11.

According to the portable computer 1 configured as described above, it is possible to improve the connection reliability of the connector 14 while improving the mounting density as in the first embodiment described above.

For example, there is a case where it is desired, for the sake of convenience of the assembly step, to finish the assembly step for assembling the sub-board 12 and the cooling device 16 into an unit before the step of attaching the sub-board 12 to the main board 11. The board unit 6 according to this embodiment is provided with the second fixing members 51 each of which is inserted in the through-hole part 52 of the main board 11 to be engaged with the second threaded hole part 53 of the support member 13, and detachably fixes the support member 13 to the main board 11. According to such a configuration, it is possible to perform coupling and fixing of the support members 13, the sub-board 12, and the pressing member 17 before attaching the sub-board 12 to the main board 11. The sub-board 12 is arranged, in a state where, for example, the pressing member 17 is fixed thereto, above (or below) the main board 11 to be fixed to the main board 11 by means of the second fixing members 51.

In the case where the heat producing component 15 and the cooling device 16 on the sub-board 12 are held and fixed before the sub-board 12 is attached to the main board 11, it becomes possible to set the pressing force of the pressing member 17 for pressing the heat pipe against the heat producing component 15 more appropriately, and realize more stable cooling performance. Further, it becomes possible to divide up the work among the spare steps, and reduce the man-hours in the final assembly step That is, it is possible to shorten the length of the main line.

Third Embodiment

Next, a portable computer 1 as an electronic apparatus according to a third embodiment of the present invention will be described below with reference to FIGS. 8 and 9. It should be noted that the configurations having functions identical with or similar to those of the configurations of the first and second embodiments described above are denoted by the reference symbols identical with those of the first and second embodiments, and a description of them will be omitted. Further, the configurations of the portable computer 1 other than those described below are identical with those of the first embodiment described above.

Figure 8:
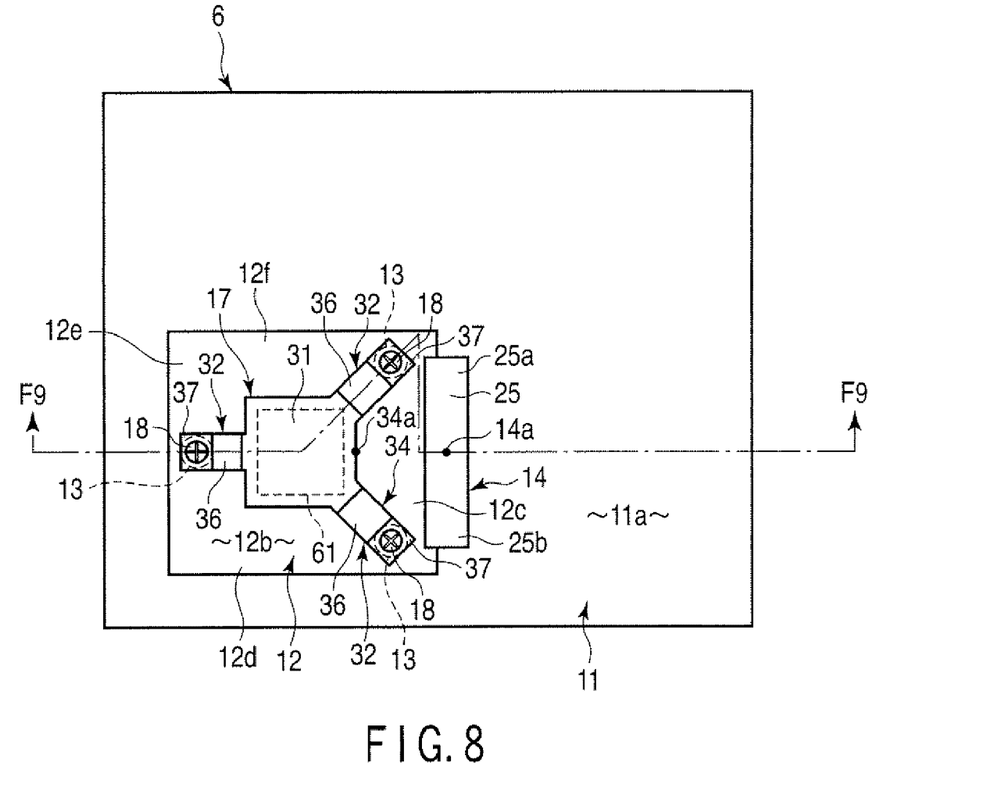
FIG. 8 is an exemplary plan view of a board unit according to a third embodiment of the present invention.

As shown in FIG. 8, a board unit 6 comprises a heat radiating member 61 (heat sink) in place of a cooling device 16 including a heat pipe 21, and the like. For example, a sheet metal member or a block made of metal corresponds to the heat radiating member 61 as a specific example.

Figure 9:
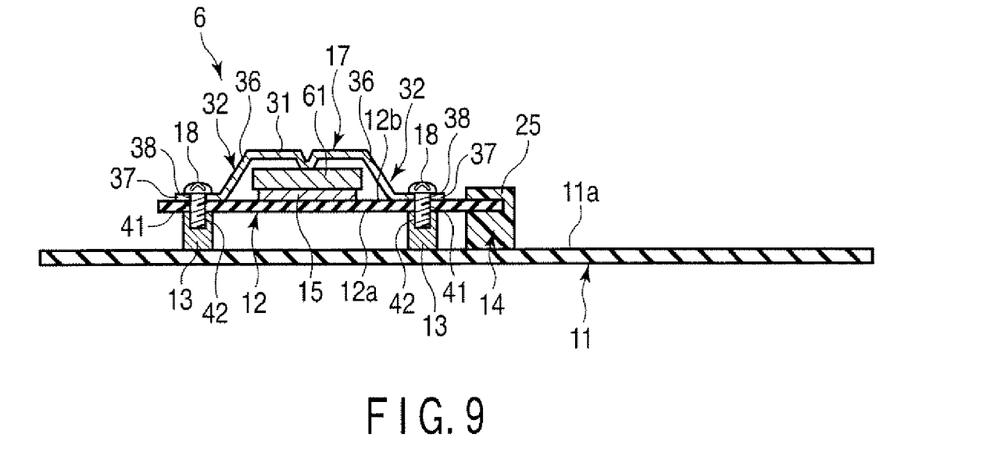
FIG. 9 is an exemplary cross-sectional view of the board unit shown in FIG. 8 taken along line F9-F9.

As shown in FIG. 9, the heat radiating member 61 is opposed to a heat producing component 15 from the opposite side of the sub-board 12. The heat radiating member 61 is thermally connected to the heat producing component 15. A pressing member 17 presses the heat radiating member 61 against the heat producing component 15. A main part 31 of the pressing member 17 is opposed to the heat radiating member 61 from the opposite side of the heat producing component 15.

According to the portable computer 1 configured as described above, it is possible to improve the connection reliability of the connector 14 while improving the mounting density as in the first embodiment described previously.

Fourth Embodiment

Next, a portable computer 1 as an electronic apparatus according to a fourth embodiment of the present invention will be described below with reference to FIG. 10. It should be noted that the configurations having functions identical with or similar to those of the configurations of the first to third embodiments described above are denoted by the reference symbols identical with those of the first to third embodiments, and a description of them will be omitted. Further, the configurations of the portable computer 1 other than those described below are identical with those of the second embodiment described above.

Figure 10:
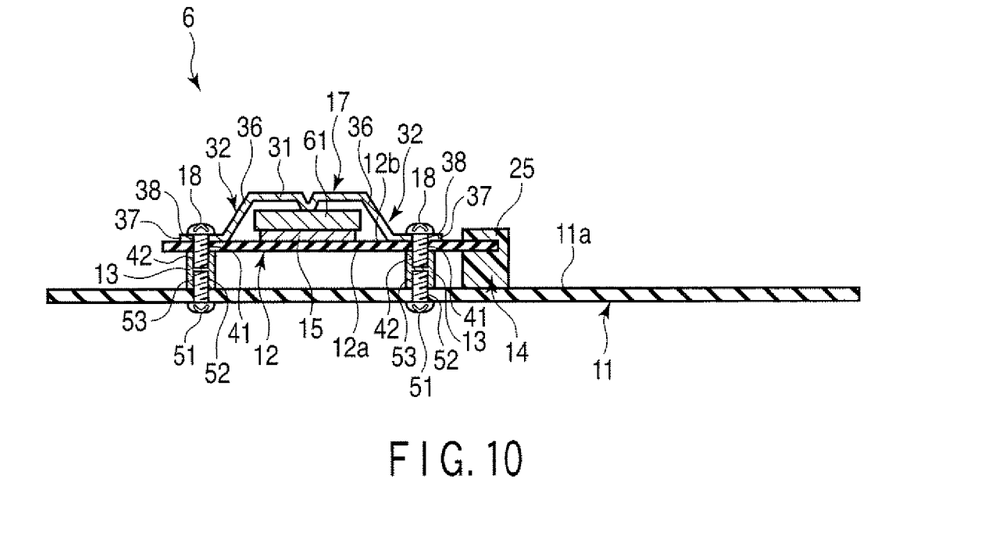
FIG. 10 is an exemplary cross-sectional view of a board unit according to a fourth embodiment of the present invention.

As shown in FIG. 10, support members 13 according to this embodiment are, as in the second embodiment, spacers or studs fixed to a sub-board 12. A board unit 6 according to this embodiment comprises second fixing members 51. Further, the board unit 6 according to this embodiment comprises, as in the third embodiment, a heat radiating member 61 in place of a cooling device 16.

According to the portable computer 1 configured as described above, it is possible to improve the connection reliability of the connector 14 while improving the mounting density as in the first embodiment described previously.

Fifth Embodiment

Next, a portable computer 1 as an electronic apparatus according to a fifth embodiment of the present invention will be described below with reference to FIG. 11. It should be noted that the configurations having functions identical with or similar to those of the configurations of the first to fourth embodiments described above are denoted by the reference symbols identical with those of the first to fourth embodiments, and a description of them will be omitted. Further, the configurations of the portable computer 1 other than those described below are identical with those of the first embodiment described above.

Figure 11:
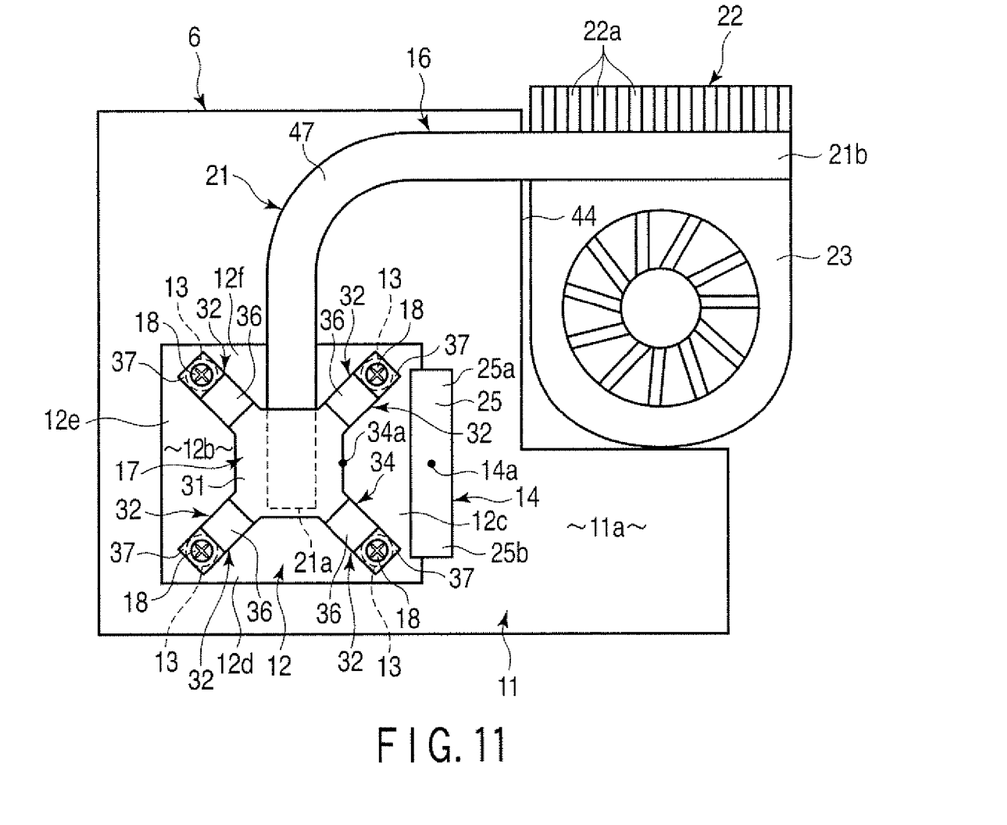
FIG. 11 is an exemplary plan view of a board unit according to a fifth embodiment of the present invention.

As shown in FIG. 11, a pressing member 17 according to this embodiment comprises, for example, four fixing parts 32, and is formed into a substantial X-shape. The four fixing parts 32 each extend from a peripheral part of a main part 31 in directions different from each other (directions different from each other by, for example, 90°). It should be noted that the substantial X-shape mentioned in the present invention need not have a strict X-shape, and comprises, for example, a X-shape having flat parts between the fixing parts 32 as shown in FIG. 11.

The two fixing parts 32 of the plurality of fixing parts 32 are located closer to the connector 14 than the main part 31 is. These two fixing parts 32 are arranged side by side in the longitudinal direction of the connector 14. The one fixing part 32 of the two fixing parts 32 is opposed to a first end part 25a which is one end part of the connector 14 in the longitudinal direction thereof. The other fixing part 32 of the above two fixing parts 32 is opposed to a second end part 25b which is the other end part of the connector 14 in the longitudinal direction thereof.

As shown in FIG. 11, of the four fixing parts 32, the two fixing parts 32 (that is, the two fixing parts 32 positioned on the connector 14 side of the main part 31) cooperate with each other to form a substantial V-shaped part 34. The pressing member 17 is arranged in such a manner that the substantial V-shaped part 34 is opposed to the connector 14.

According to the portable computer 1 configured as described above, it is possible to improve the connection reliability of the connector 14 while improving the mounting density as in the first embodiment described previously.

That is, as in the first embodiment described previously, the fixing structure coupling the sub-board 12 and the main board 11 to each other is realized in the vicinity of the connector 14. The part around the connector 14 is held relatively firm by the fixing structure, and hence the stress imposed on the connector 14 is reduced. As a result, the connection reliability of the connector 14 is improved.

The pressing member 17 having the substantial X-shape is arranged in such a manner that the substantial V-shaped part 34 thereof is opposed to the connector 14. As a result, it is possible to arrange the two fixing parts 32 in the vicinity of the connector 14, and improve the connection reliability of the connector 14 by using the pressing member 17 including four fixing parts 32.

Sixth Embodiment

Next, a portable computer 1 as an electronic apparatus according to a sixth embodiment of the present invention will be described below with reference to FIG. 12. It should be noted that the configurations having functions identical with or similar to those of the configurations of the first to fifth embodiments described above are denoted by the reference symbols identical with those of the first embodiment, and a description of them will be omitted. Further, the configurations of the portable computer 1 other than those described below are identical with those of the fifth embodiment described above.

Figure 12:
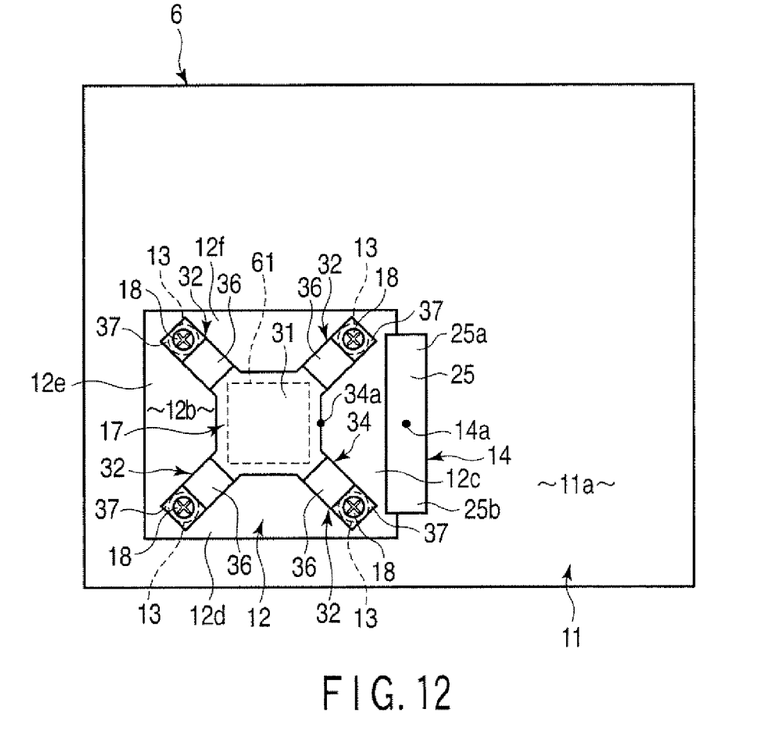
FIG. 12 is an exemplary plan view of a board unit according to a sixth embodiment of the present invention.

As shown in FIG. 12, a board unit 6 comprises a heat radiating member 61 in place of a cooling device 16 as in the third embodiment. A pressing member 17 according to this embodiment comprises, for example, four fixing parts 32, and is formed into a substantial X-shape as in the fifth embodiment. Of the four fixing parts 32, the two fixing parts 32 cooperate with each other to form a substantial V-shaped part 34. The pressing member 17 is arranged in such a manner that the substantial V-shaped part 34 is opposed to the connector 14.

According to the portable computer 1 configured as described above, it is possible to improve the connection reliability of the connector 14 while improving the mounting density as in the first embodiment described previously.

Seventh Embodiment

Next, a portable computer 1 as an electronic apparatus according to a seventh embodiment of the present invention will be described below with reference to FIG. 13. It should be noted that the configurations having functions identical with or similar to those of the configurations of the first to sixth embodiments described above are denoted by the reference symbols identical with those of the first to sixth embodiments, and a description of them will be omitted. Further, the configurations of the portable computer 1 other than those described below are identical with those of the first embodiment described previously.

Figure 13:
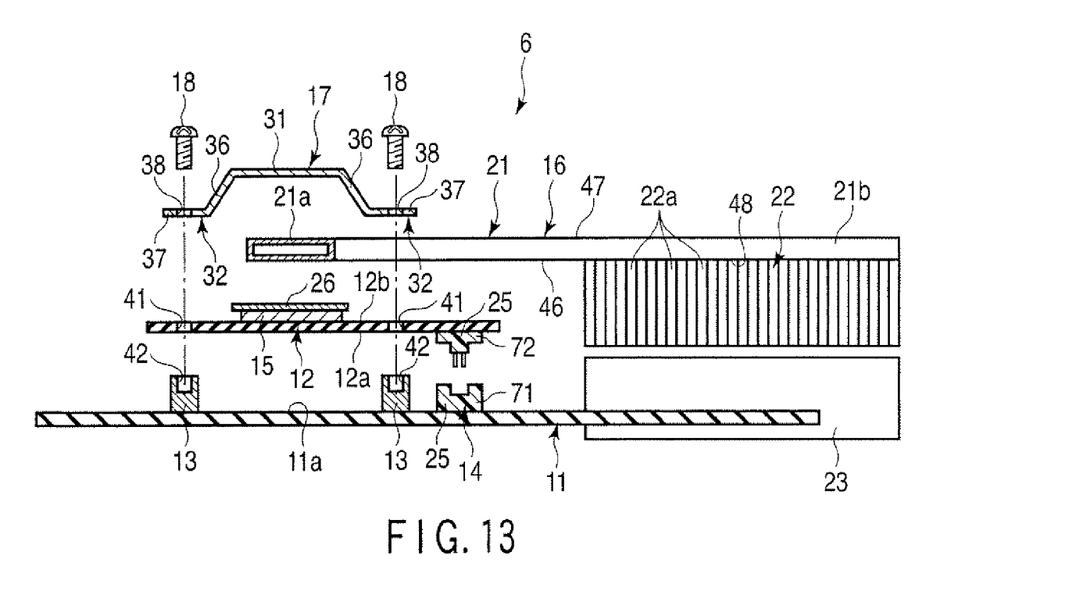
FIG. 13 is an exemplary cross-sectional view of a board unit according to a seventh embodiment of the present invention.

As shown in FIG. 13, a connector 14 according to this embodiment is a stacking connector. The connector 14 which is a stacking connector comprises first and second parts 71 and 72 that are detachable from each other. The first part 71 is, for example, a female part, and is fixed to a main board 11. The second part 72 is, for example, a male part, and is fixed to a sub-board 12. The second part 72 is engaged with the first part 71, whereby the sub-board 12 is electrically connected to the main board 11.

According to the portable computer 1 configured as described above, it is possible to improve the connection reliability of the connector 14 while improving the mounting density as in the first embodiment described previously.

Whereas the stacking connector can connect a large number of circuits in high density, the connector is relatively weak against external stress. However, in the portable computer 1 according to this embodiment, as in the first embodiment, a fixing structure for coupling the sub-board 12 and the main board 11 to each other is realized in the vicinity of the connector 14. The stress imposed on the connector 14 is reduced by virtue of the fixing structure. Accordingly, the structure in which the two fixing parts 32 of the plurality of fixing parts 32 are positioned on the connector side of the main part 31 is particularly useful for the stacking connector.

Eighth Embodiment

Next, a portable computer 1 as an electronic apparatus according to an eighth embodiment of the present invention will be described below with reference to FIG. 14. It should be noted that the configurations having functions identical with or similar to those of the configurations of the first to seventh embodiments described above are denoted by the reference symbols identical with those of the first to seventh embodiments, and a description of them will be omitted. Further, the configurations of the portable computer 1 other than those described below are identical with those of the first embodiment described previously.

Figure 14:
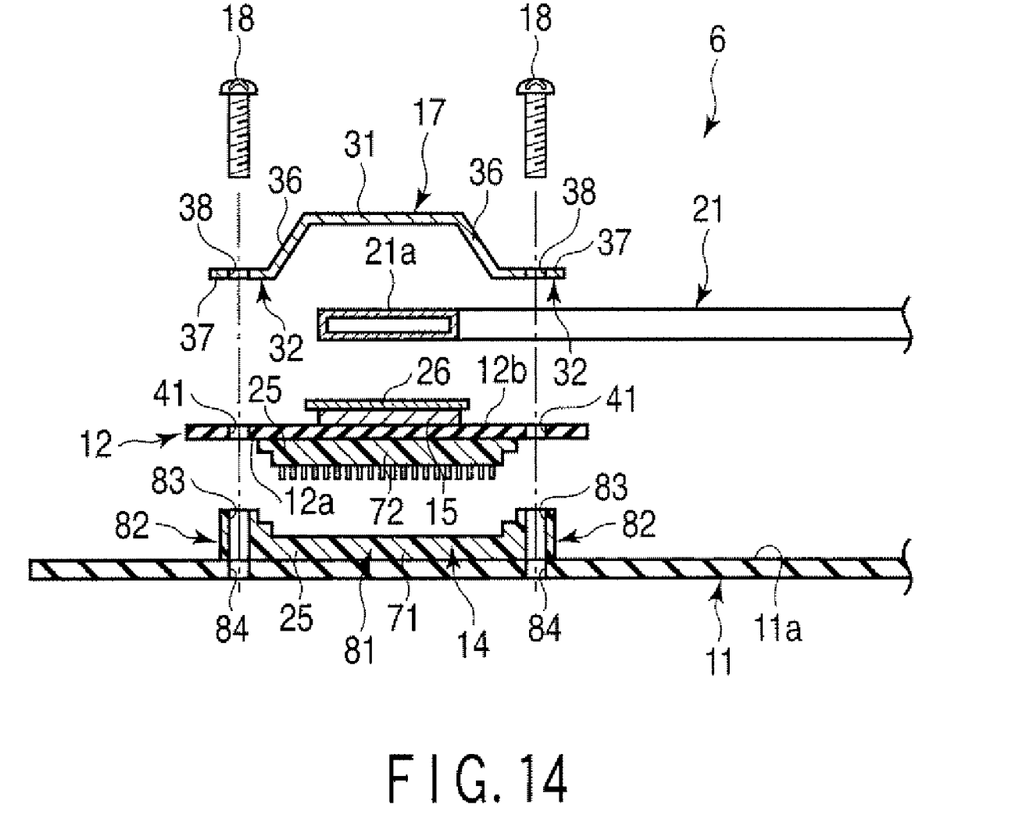
FIG. 14 is an exemplary cross-sectional view of a board unit according to an eighth embodiment of the present invention.

As shown in FIG. 14, a connector 14 according to this embodiment is a stacking connector. Further, the connector 14 according to this embodiment comprises a connector main body part 81 including first and second parts 71 and 72, and a pair of connector fixing parts 82 provided on both sides of the connector main body part 81. Each of the connector fixing parts 82 is an example of the support member mentioned in the present invention, and is interposed between a main board 11 and a sub-board 12.

Through-hole parts 38 of fixing parts 32 of a pressing member 17, and through-hole parts 41 of the sub-board 12 are opposed to the connector fixing parts 82. Each of the connector fixing parts 82 comprises a through-hole part 83 communicating with the through-hole part 41 of the sub-board 12. The main board 11 comprises threaded hole parts 84 communicating with the through-hole parts 83 of the connector fixing parts 82.

As shown in FIG. 14, fixing members 18 are inserted in the through-hole parts 38 of the fixing parts 32 of the pressing member 17, the through-hole parts 41 of the sub-board 12, and the through-hole parts 83 of the connector fixing parts 82, and are engaged with the threaded hole parts 84 of the main board 11. As a result, the fixing members 18 integrally fix the pressing member 17, the sub-board 12, the connector 14, and the main board 11 as one body.

According to the portable computer 1 configured as described above, it is possible to improve the connection reliability of the connector 14 while improving the mounting density as in the first embodiment described previously.

Further, in this embodiment, each of the fixing members 18 for fixing the pressing member 17 also plays a role of a fixing member in fixing the sub-board 12 to the main board 11, and a role of a fixing member in fixing the connector 14 to the main board 11. According to the configuration as described above, it is possible to omit a fixing structure to be originally provided to fix the connector 14 to the main board 11. This contributes to the improvement in the mounting density, and reduction in the number of components.

The portable computer 1 according to each of the first to eighth embodiments of the present invention has been described above. However, the present invention is not limited to these embodiments. Constituent elements according to each embodiment can be appropriately combined with each other to carry out the invention. For example, in the second to sixth embodiments, the stacking connector according to the seventh or eighth embodiment may be used as the connector.

Further, the present invention can be embodied in the implementation stage by modifying the constituent elements within the scope not deviating from the gist of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:

a housing;

a main board contained in the housing;

a sub-board having a first surface facing the main board, and a second surface on the other side of the first surface;

a connector provided along an edge portion of the sub-board and electrically connecting the sub-board to the main board;

a heat producing component having a first side mounted on the second surface of the sub-board and a second side opposite the first side;

a heat pipe thermally connecting to the second side of the heat producing component;

a pressing member comprising a main part pressing the heat pipe against the heat producing component, a first fixing part located close to a first end portion of the connector, and a second fixing part located close to a second end portion of the connector;

two support members interposed between the main board and the sub-board, and arranged at positions corresponding to the first and second fixing parts of the pressing member; and two fixing members which fix the first and second fixing parts of the pressing member to the sub-board, and fix the sub-board to the support members at positions that are closer to the connector than the main part is.

2. The electronic apparatus of claim 1, wherein each of the fixing parts comprises a first through-hole part, the sub-board comprises a second through-hole part that communicates with the first through-hole part for each of the fixing parts, each of the support members is fixed to the main board, and comprises a threaded hole part communicating with the second through-hole part, and each of the fixing members is inserted in the first through-hole part and the second through-hole part, and is engaged with the threaded hole part.

3. The electronic apparatus of claim 1, wherein the fixing parts are arranged in a longitudinal direction of the connector.

4. The electronic apparatus of claim 1, wherein the pressing member further comprises a third fixing part with the three fixing parts formed into a substantial Y-shape and the first and second fixing parts formed into a substantial V-shaped part opposed to the connector.

5. The electronic apparatus of claim 1, wherein the pressing member further comprises third and fourth fixing parts with the four fixing parts formed into a substantial X-shape and the first and second fixing parts formed into a substantial V-shaped part opposed to the connector.

6. The electronic apparatus of claim 1, wherein the connector is a stacking connector.

7. An electronic apparatus comprising:

a housing;

a main board contained in the housing;

a sub-board having a first surface facing the main board, and a second surface on the other side of the first surface;

a connector provided along an edge portion of the sub-board and electrically connecting the sub-board to the main board;

a heat producing component having a first side mounted on the second surface of the sub-board and a second side opposite the first side;

a heat radiating member thermally connecting to the second side of the heat producing component;

a pressing member comprising a main part pressing the heat pipe against the heat producing component, a first fixing part located close to a first end portion of the connector, and a second fixing part located close to a second end portion of the connector;

two support members interposed between the main board and the sub-board, and arranged at positions corresponding to the first and second fixing parts of the pressing member; and two fixing members which fix the first and second fixing parts of the pressing member to the sub-board, and fix the sub-board to the support members at positions that are closer to the connector than the main part is.

8. The electronic apparatus of claim 7, wherein
each of the fixing parts comprises a first through-hole part,
the sub-board comprises a second through-hole part that communicates with the first through-hole part for each of the fixing parts,
each of the support members is fixed to the main board, and comprises a threaded hole part communicating with the second through-hole part, and
each of the fixing members is inserted in the first through-hole part, and the second through-hole part, and is engaged with the threaded hole part.

9. The electronic apparatus of claim 7, wherein
the fixing parts are arranged in a longitudinal direction of the connector.

10. The electronic apparatus of claim 7, wherein
the pressing member further comprises a third fixing part with the three fixing parts formed into a substantial Y-shape and the first and second fixing parts formed into a substantial V-shaped part opposed to the connector.

11. The electronic apparatus of claim 7, wherein
the pressing member further comprises third and fourth fixing parts with the four fixing parts formed into a substantial X-shape and the first and second fixing parts formed into a substantial V-shaped part opposed to the connector.

* * * * *